US012617942B1

(12) United States Patent
Lin

(10) Patent No.: US 12,617,942 B1
(45) Date of Patent: May 5, 2026

(54) RESIN COMPOSITION AND APPLICATIONS OF THE SAME

(71) Applicant: TAIWAN UNION TECHNOLOGY CORPORATION, Zhubei City (TW)

(72) Inventor: Tsung-Hsien Lin, Zhubei City (TW)

(73) Assignee: Taiwan Union Technology Corporation, Zhubei City (TW)

( * ) Notice: Subject to any disclaimer, the term of this patent is extended or adjusted under 35 U.S.C. 154(b) by 0 days.

(21) Appl. No.: 19/070,994

(22) Filed: Mar. 5, 2025

(30) Foreign Application Priority Data

Nov. 1, 2024 (TW) ................................ 113141987

(51) Int. Cl.

| | |
|---|---|
| ***B32B 3/16*** | (2006.01) |
| ***C08J 5/24*** | (2006.01) |
| ***C08L 63/00*** | (2006.01) |
| ***C09D 7/40*** | (2018.01) |
| ***C09D 7/61*** | (2018.01) |
| ***C09D 163/00*** | (2006.01) |
| ***H05K 1/03*** | (2006.01) |
| *C08K 3/22* | (2006.01) |

(52) U.S. Cl.
CPC ................ *C08L 63/00* (2013.01); *B32B 3/16* (2013.01); *C08J 5/244* (2021.05); *C08J 5/249* (2021.05); *C09D 7/61* (2018.01); *C09D 7/69* (2018.01); *C09D 163/00* (2013.01); *H05K 1/0366* (2013.01); *C08J 2363/02* (2013.01); *C08J 2461/12* (2013.01); *C08K 2003/2227* (2013.01); *C08K 2201/005* (2013.01)

(58) Field of Classification Search
CPC .... B32B 3/00; B32B 3/14; B32B 3/16; B32B 2457/08
See application file for complete search history.

(56) References Cited

FOREIGN PATENT DOCUMENTS

| | | | |
|---|---|---|---|
| CN | 101654004 | A | 2/2010 |
| CN | 102585440 | A | 7/2012 |
| CN | 113583383 | A | 11/2021 |
| JP | 2011178883 | A | 9/2011 |

OTHER PUBLICATIONS

CN 102382422 (Year: 2012).*
CN 106916418 (Year: 2017).*

* cited by examiner

*Primary Examiner* — Elizabeth E Mulvaney
(74) *Attorney, Agent, or Firm* — Christensen, Fonder, Dardi & Herbert PLLC; John P. Fonder

(57) ABSTRACT

A resin composition is provided. The resin composition comprises (A) an epoxy resin, (B) a dicyclopentadiene-based phenol resin, and (C) a first filler. The first filler is a boehmite filler having a D50 diameter ranging from 1 μm to 4 μm.

15 Claims, No Drawings

RESIN COMPOSITION AND APPLICATIONS OF THE SAME

CLAIM FOR PRIORITY

This application claims the benefit of Taiwan Patent Application No. 113141987 filed on Nov. 1, 2024, the subject matters of which are incorporated herein in their entirety by reference.

BACKGROUND OF THE INVENTION

Field of the Invention

The present invention provides a resin composition, especially a resin composition comprising an epoxy resin, a dicyclopentadiene-based phenol resin, and a specific filler. The resin composition of the present invention can either be used in combination with a reinforcing material to constitute a prepreg or serve as an adhesive for metal foils, facilitating the production of metal-clad laminates and printed circuit boards (PCBs).

Descriptions of the Related Art

PCBs serve as circuit substrates in electronic devices, providing stability and electrical connections for electronic components. Traditional PCBs, known as copper-clad laminates (CCLs), consist primarily of resins, reinforcing materials and copper foils. Resins include epoxy resins, phenolic resins, polyamine formaldehyde resins, silicone, and Teflon. Reinforcing materials include glass fiber cloths, glass fiber mats, insulating papers, and linen cloths.

PCBs are typically produced by the following method: impregnating a reinforcing material, such as a glass fiber fabric, with a resin composition (such as an epoxy resin composition) and partially curing the impregnated glass fiber fabric to a half-cured state (i.e., B-stage) to obtain a prepreg; superimposing specific layers of the prepregs and superimposing a metal foil on at least one external surface of the superimposed prepregs to provide a superimposed object; hot-pressing the superimposed object (i.e., C-stage) to obtain a metal-clad laminate; etching the metal foil on the surface of the metal-clad laminate to form a defined circuit pattern; and drilling a plurality of holes on the metal-clad laminate and plating these holes with a conductive material to form via holes to complete the printed circuit board.

In recent years, due to the multi-functionalization and high-performance development of household electronic products, the circuits used in printed circuit boards have become increasingly dense. Additionally, since the voltage used in such electronic products is relatively high, the requirements for insulation reliability between circuits have become more stringent. In particular, when these electronic products are used in harsh environments such as high temperature, humidity, and contamination, dust, moisture, and pollutants can easily accumulate on the surface of the insulating substrate of the circuit board. This accumulation can lead to the formation of dissociable contaminants, which, under the influence of an external electric field, can easily cause partial discharges that form conductive or partially conductive channels, leading to progressive degradation of the surface of material and a significant reduction in the performance of the end circuit or electrical properties. The "leakage tracking phenomenon" refers to the process in which a conductive channel gradually forms under the influence of dissociable contaminants and an external electric field. In this process, repeated arc discharge between the circuits generates electrical sparks, which can easily form traces of carbonized conductive circuits, thereby damaging the insulating performance of the substrate surface. The "leakage tracking index" is used to measure the ability of insulating materials to resist leakage tracking. The higher the index, the less likely the material is to experience leakage tracking.

In order to improve the leakage tracking index of material, CN 101654004 and CN 102585440 teach the use of low-bromine content epoxy resins (bromine content of 10 wt % to 15 wt %) or halogen-free epoxy resins, along with the addition of a large amount of aluminum hydroxide inorganic fillers. However, the excessive use of aluminum hydroxide can lead to a decrease in heat resistance, as aluminum hydroxide has a low thermal decomposition temperature, beginning to dehydrate at 200° C. This causes the resulting substrate to easily delaminate and bubble at high temperatures, thus affecting the thermal reliability of the product.

For the safety and reliability of electronic products, especially the insulation reliability of printed circuit boards used in humid and easily contaminated environments, there is an urgent need to develop an insulating substrate with a high comparative tracking index (CTI).

SUMMARY OF THE INVENTION

In view of the aforementioned technical problems, the present invention aims to provide a resin composition that includes epoxy resin, dicyclopentadiene-based phenol resin, and specific fillers. The electronic materials obtained by curing the resin composition have high glass transition temperature (Tg), low coefficient of thermal expansion (CTE), high heat resistance (as indicated by T288, solder resistance, and heat resistance after moisture absorption), low water absorption, high flame retardance, excellent filling property, and high comparative tracking index (CTI). In particular, the inventor surprisingly discovered that by using dicyclopentadiene-based phenol resin and boehmite with a specific particle size in the epoxy resin system, it is possible to improve the resistance to water absorption and filling property issues that are commonly encountered when boehmite is used in epoxy resin systems.

Therefore, an objective of the present invention is to provide a resin composition, comprising:

(A) an epoxy resin;

(B) a dicyclopentadiene-based phenol resin; and (C) a first filler, which is a boehmite filler having a D50 diameter ranging from 1 μm to 4 μm.

In an embodiment of the present invention, the epoxy resin (A) is selected from the group consisting of a bisphenol epoxy resin, a phenolic epoxy resin, a trifunctional epoxy resin, a diphenylethylene epoxy resin, a triazine skeleton-containing epoxy resin, a fluorene skeleton-containing epoxy resin, a triphenol methane epoxy resin, a xylylene epoxy resin, a biphenyl epoxy resin, a biphenyl aralkyl epoxy resin, a naphthalene epoxy resin, an alicyclic epoxy resin, and combinations thereof.

In an embodiment of the present invention, the dicyclopentadiene-based phenol resin (B) has a structure represented by the following formula (I):

formula (I)

$$Ph-(D-Ph)_n-D-Ph$$

wherein, n is an integer of 2 to 50;

Ph is independently a hydroxyl-containing group derived from an aromatic phenol compound; and D has a structure represented by the following formula (II), and each D is the same or different:

formula (II)

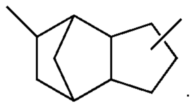

In an embodiment of the present invention, the content of the dicyclopentadiene-based phenol resin ranges from 3 wt % to 15 wt % based on the total weight of the resin composition excluding solvent.

In an embodiment of the present invention, the content of the first filler ranges from 10 wt % to 31 wt % based on the total weight of the resin composition excluding solvent.

In an embodiment of the present invention, the resin composition further comprises a curing agent selected from the group consisting of a cyanate ester resin, a benzoxazine resin, a non-dicyclopentadiene-based phenol resin, a styrene maleic anhydride (SMA) resin, dicyandiamide (Dicy), diaminodiphenyl sulfone (DDS), diaminodiphenylmethane, and combinations thereof.

In an embodiment of the present invention, the resin composition further comprises a second filler selected from the group consisting of silica, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, polytetrafluoroethylene (PTFE), glass beads, ceramic whiskers, carbon nanotubes, nanosized inorganic powders, and combinations thereof.

Another objective of the present invention is to provide a prepreg, which is prepared by impregnating a substrate with the aforementioned resin composition or by coating the aforementioned resin composition onto a substrate and drying the impregnated or coated substrate.

Another objective of the present invention is to provide a metal-clad laminate prepared by laminating the aforementioned prepreg and a metal foil or by coating the aforementioned resin composition onto a metal foil and drying the coated metal foil.

Another objective of the present invention is to provide a printed circuit board prepared from the aforementioned metal-clad laminate.

To render the above objectives, technical features and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENTS

Hereinafter, some embodiments of the present invention will be described in detail. However, the present invention may be embodied in various embodiments and should not be limited to the embodiments described in the specification.

Unless otherwise specified, the expressions "a," "the," or the like recited in the specification and the claims should include both the singular and the plural forms.

Unless otherwise specified, the terms "first," "second," or similar expressions used in the specification and claims are employed solely for the purpose of distinguishing the depicted elements or components without any specific significance. Those terms are not intended to imply priority.

Unless otherwise specified, in the specification and the claims, the D50 particle size, also referred to as the median particle size, is measured using a particle size distribution measurement device (HORIBA LB-550 DLS, manufactured by HORIBA) based on dynamic light scattering of laser light. It corresponds to the particle size at which 50% of volume is accumulated. The D90 particle size is measured using the same distribution measurement device, based on dynamic light scattering of laser light, and corresponds to the particle size at which 90% of volume is accumulated.

The resin composition of the present invention involves the combined use of epoxy resin (A), dicyclopentadiene-based phenol resin (B), and first filler (C) with a specific particle size. The electronic materials obtained by curing the resin composition have high glass transition temperature (Tg), low coefficient of thermal expansion (CTE), high heat resistance (as indicated by T288, solder resistance, and heat resistance after moisture absorption), low water absorption, high flame retardance, excellent filling property, and high comparative tracking index (CTI). The resin composition of the present invention and its applications are described in detail below.

1. RESIN COMPOSITION

The resin composition of the present invention comprises an epoxy resin (A), a dicyclopentadiene-based phenol resin (B), and a first filler with a specific particle size (C) as essential components. It may further comprise optional components. The detailed descriptions of these components are as follows.

1.1. (A) Epoxy Resin

In the present invention, an epoxy resin refers to a thermosetting resin containing at least two epoxy functional groups in a single molecule, such as polyfunctional epoxy resins and phenolic epoxy resins. Examples of polyfunctional epoxy resins include but are not limited to, bifunctional epoxy resins, trifunctional epoxy resins, tetrafunctional epoxy resins, and octafunctional epoxy resins. The species of epoxy resin for the present invention is not limited and can be selected by persons having ordinary skill in the art based on the disclosure of the subject specification and specific requirements. For example, a bromine-containing epoxy resin may be used to enhance the flame retardance properties of the resin composition. Alternatively, a halogen-free (e.g., bromine-free) epoxy resin may be used to meet environmentally friendly criteria.

Examples of epoxy resin include but are not limited to, a bisphenol epoxy resin, a phenolic epoxy resin, a diphenylethylene epoxy resin, a triazine skeleton-containing epoxy resin, a fluorene skeleton-containing epoxy resin, a triphenol methane epoxy resin, a xylylene epoxy resin, a biphenyl epoxy resin, a biphenyl aralkyl epoxy resin, a naphthalene epoxy resin, and an alicyclic epoxy resin. Examples of bisphenol epoxy resin include, but are not limited to, bisphenol A epoxy resin, bisphenol F epoxy resin, and bisphenol S epoxy resin. Examples of phenolic epoxy resin (e.g., linear phenolic epoxy resin) include, but are not limited to, phenol phenolic epoxy resin, cresol phenolic epoxy resin, bisphenol A phenolic epoxy resin, and bisphenol F phenolic epoxy resin. Examples of alicyclic epoxy resin include, but are not limited to, dicyclopentadiene (DCPD) epoxy resin. Examples of epoxy resin also include the diglycidyl ether compounds of polyfunctional phenol and polycyclic aromatic compounds such as anthracene.

The aforementioned epoxy resins can be used alone or in any combination depending on the need. In an embodiment of the present invention, bisphenol A epoxy resin, a trifunctional epoxy resin, or a combination thereof is used.

In the resin composition of the present invention, based on the total weight of the resin composition excluding solvent, the amount of the epoxy resin can be 30 wt % to 45 wt %. For example, based on the total weight of the resin composition excluding solvent, the amount of the epoxy resin can be 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, 44 wt %, or 45 wt %, or within a range between any two of the values described herein.

1.2. (B) Dicyclopentadiene-Based Phenol Resin

Dicyclopentadiene-based phenol resin has reactive functional groups that can undergo crosslinking reactions with components having epoxy groups. In the present invention, dicyclopentadiene-based phenol resin refers to any phenol resin that contains at least one tricyclic decyl group structure derived from dicyclopentadiene in its molecule.

Dicyclopentadiene-based phenol resin can be obtained by reacting a dicyclopentadiene compound with a phenol compound. For example, dicyclopentadiene-based phenol resin can be obtained by reacting a dicyclopentadiene compound with a phenol compound in the presence of an acidic catalyst. The aforementioned phenol compound may be an aromatic phenol compound, that is, an aromatic compound where the hydrogen on the aromatic ring is substituted by a hydroxyl group (—OH). Depending on the number of hydrogen atoms substituted by hydroxyl groups on the aromatic ring, it can be a monophenol, a diphenol, or a polyphenol. Examples of aromatic phenol compounds include, but are not limited to, phenol, ortho-hydroxyphenol, meta-hydroxyphenol, para-hydroxyphenol, ortho-cresol, meta-cresol, para-cresol, 2-ethylphenol, 4-ethylphenol, butylphenol, tert-butylphenol, 2,6-dimethylphenol, 3,4-dimethylphenol, 3,5-dimethylphenol, bisphenol A, bisphenol F, bisphenol S, naphthol, hydroxyanthracene, and phenolic resins. The aforementioned phenol compounds can be used alone or in any combination.

In an embodiment of the present invention, dicyclopentadiene-based phenol resin (B) has a structure represented by the following formula (I):

formula (I)

$$Ph\text{—}(D\text{—}Ph)_n\text{—}D\text{—}Ph$$

wherein, n is an integer of 2 to 50;

Ph is independently a hydroxyl-containing group derived from an aromatic phenol compound, and examples of Ph include, but are not limited to, hydroxyl-containing groups derived from the following aromatic phenol compounds: phenol, ortho-hydroxyphenol, meta-hydroxyphenol, para-hydroxyphenol, ortho-cresol, meta-cresol, para-cresol, 2-ethylphenol, 4-ethylphenol, butylphenol, tert-butylphenol, 2,6-dimethylphenol, 3,4-dimethylphenol, 3,5-dimethylphenol, bisphenol A, bisphenol F, bisphenol S, naphthol, hydroxyanthracene, and phenolic resins; and D has a structure represented by the following formula (II), and each D is the same or different:

formula (II)

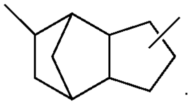

In an embodiment of the present invention, the dicyclopentadiene-based phenol resin (B) has a structure represented by the following formula (III):

formula (III)

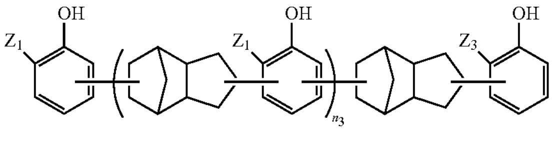

wherein, $Z_1$, $Z_2$, and $Z_3$ are independently —H, —$CH_3$, or —$C(CH_3)_3$; and $n_3$ is an integer of 2 to 50.

Commercially available dicyclopentadiene-based phenol resins include products such as PF-9110 from Chang Chun (CCP) Company, KPE-F6115 from Kolon Company, SH-7090, SH-7110, SH-7117, and SH-7140 from Shengquan Group, ERM-6105, ERM-6095, ERM-6115, and ERM-6140 from Songwon Company, and KY-616 from Guangzhou Lixin Company. The aforementioned dicyclopentadiene-based phenol resins can be used individually or in any combination. In an embodiment of the present invention, the dicyclopentadiene-based phenol resin is selected from PF-9110 and KY-616.

In the resin composition of the present invention, based on the total weight of the resin composition excluding solvent, the amount of the dicyclopentadiene-based phenol resin can be 3 wt % to 15 wt %. For example, based on the total weight of the resin composition excluding solvent, the amount of the dicyclopentadiene-based phenol resin can be 3 wt %, 4 wt %, 5 wt %, 6 wt %, 7 wt %, 8 wt %, 9 wt %, 10 wt %, 11 wt %, 12 wt %, 13 wt %, 14 wt %, or 15 wt %, or within a range between any two of the values described herein. When the content of dicyclopentadiene-based phenol resin satisfies the above range, the filling property and resistance to water absorption of the resin composition can be improved.

1.3. (C) First Filler

The first filler is a boehmite filler. Boehmite is a monohydrate of aluminum oxide, which can be produced by hydrothermally treating aluminum hydroxide at temperatures ranging from 150° C. to 300° C. in an autoclave, followed by crystallization to form the monohydrate of aluminum oxide. The present invention achieves a synergistic effect by the combined use of dicyclopentadiene-based phenol resin and the first filler, which not only improves the poor resistance to water absorption caused by adding boehmite filler to the epoxy resin system but also results in electronic materials with a high comparative tracking index (CTI) and good filling property.

According to the present invention, the first filler has a D50 diameter ranging from 1 μm to 4 μm, more specifically from 1 μm to 3 μm. For example, the D50 diameter of the first filler can be 1 μm, 1.1 μm, 1.2 μm, 1.3 μm, 1.4 μm, 1.5 μm, 1.6 μm, 1.7 μm, 1.8 μm, 1.9 μm, 2 μm, 2.1 μm, 2.2 μm, 2.3 μm, 2.4 μm, 2.5 μm, 2.6 μm, 2.7 μm, 2.8 μm, 2.9 μm, 3 μm, 3.1 μm, 3.2 μm, 3.3 μm, 3.4 μm, 3.5 μm, 3.6 μm, 3.7 μm, 3.8 μm, 3.9 μm, or 4 μm, or within a range between any two of the values described herein. Within the aforementioned range, two or more boehmite fillers with different D50 particle sizes may be combined as the first filler as needed. If the D50 particle size of the first filler exceeds the aforementioned range, the resin composition exhibits poor filling property and resistance to water absorption.

In an embodiment of the present invention, under the condition that the D50 particle size meets the aforementioned requirements, the D90 particle size of the first filler may range from 1 μm to 9 μm, and more specifically, from 1 μm to 5 μm. For example, the D90 diameter of the first filler can be 1 μm, 1.5 μm, 2 μm, 2.5 μm, 3 μm, 3.5 μm, 4 μm, 4.5 μm, 5μ, 5.5 μm, 6 μm, 6.5 μm, 7 μm, 7.5 μm, 8 μm, 8.5 μm, or 9 μm, or within a range between any two of the values described herein.

Under the condition that the D50 particle size meets the aforementioned requirements, the shape of the first filler is not limited, and may be, for example, granular, plate-like, needle-like, or polyhedral, but the present invention is not limited to these shapes.

Commercially available boehmite include products such as BM0015 and BM0155 from Suzhou Ginet New Material Technology Company, and BG-601, BG-611, BG-613, and BG-403 from Anhui Estone Materials Company. The aforementioned boehmite products can be used individually or in any combination. In an embodiment of the present invention, the first filler is BM0015 or BG-611.

In the resin composition of the present invention, based on the total weight of the resin composition excluding solvent, the amount of the first filler can be 10 wt % to 31 wt %. For example, based on the total weight of the resin composition excluding solvent, the amount of the first filler can be 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, or 31 wt %, or within a range between any two of the values described herein. Research has found that when the content of dicyclopentadiene-based phenol resin is 3 wt % to 15 wt % and the amount of the first filler ranges from 10 wt % to 31 wt %, based on the total weight of the resin composition excluding solvent, excellent filling property and resistance to water absorption can be achieved simultaneously.

1.4. Optional Components

In addition to the aforementioned components, the resin composition of the present invention may further comprise optional components to improve specific physicochemical properties of the material prepared from the resin composition or to improve the processibility of the resin composition. The optional components can encompass various conventional additives known in the art, such as curing agents, curing accelerators, fillers other than the first filler (C) (hereinafter also refers to "second filler"), dispersing agents, elastomers, tougheners, viscosity modifiers, flame retardants, plasticizers, coupling agents, and the like. The additives do not constitute the core aspect of the present invention. They can be carried out by persons having ordinary skills in the art based on the disclosure of the subject specification and their skill level. The subsequent paragraphs elaborate on the optional components, focusing on curing agents, curing accelerators, and the second filler.

1.4.1. Curing Agent

The resin composition of the present invention can further comprise a curing agent. The curing agent can be any conventional curing agent suitable for an epoxy resin, including hydroxyl-containing compounds, amino-containing compounds, anhydride compounds, and active ester compounds. Examples of the curing agent include, but are not limited to, a cyanate ester resin, a benzoxazine resin, a non-dicyclopentadiene-based phenol resin (i.e., a phenol resin other than dicyclopentadiene-based phenol resin), a styrene maleic anhydride (SMA) resin, dicyandiamide (Dicy), diaminodiphenyl sulfone (DDS), and diaminodiphenylmethane. Examples of the non-dicyclopentadiene-based phenol resin include, but are not limited to, an amino triazine novolac (ATN) resin and styrene-vinylphenol copolymer. The aforementioned curing agents can be used alone or in any combination. In an embodiment of the present invention, a benzoxazine resin, dicyandiamide, or a combination thereof is used.

Based on the total weight of the resin composition excluding solvent, the amount of the curing agent can be 0 wt % to 15 wt %. For example, based on the total weight of the resin composition excluding solvent, the amount of the curing agent can be 0.1 wt %, 0.5 wt %, 1 wt %, 1.5 wt %, 2 wt %, 2.5 wt %, 3 wt %, 3.5 wt %, 4 wt %, 4.5 wt %, 5 wt %, 5.5 wt %, 6 wt %, 6.5 wt %, 7 wt %, 7.5 wt %, 8 wt %, 8.5 wt %, 9 wt %, 9.5 wt %, 10 wt %, 10.5 wt %, 11 wt %, 11.5 wt %, 12 wt %, 12.5 wt %, 13 wt %, 13.5 wt %, 14 wt %, 14.5 wt %, or 15 wt %, or within a range between any two of the values described herein, but the present invention is not limited thereto.

1.4.2. Curing Accelerator

The resin composition of the present invention can further comprise a curing accelerator. The curing accelerator can promote the reaction of epoxy functional groups and lower the curing reaction temperature of the resin composition. Examples of the curing accelerator include tertiary amines, quaternary amines, imidazole-based compounds, and pyridine-based compounds. The aforementioned curing accelerators can be used alone or in any combination. In an embodiment of the present invention, the curing accelerator is an imidazole compound, a pyridine compound, or a combination thereof. Examples of the imidazole compound include, but are not limited to, 2-methyl-imidazole (2 MI), 2-ethyl-4-methyl-imidazole (2E4MZ), and 2-phenyl-imidazole (2PI). Examples of the pyridine compound include, but are not limited to, 2,3-diaminopyridine, 2,5-diaminopyridine, 2,6-diaminopyridine, 4-dimethylaminopyridine, 2-amino-3-methylpyridine, 2-amino-4-methylpyridine, and 2-amino-3-nitropyridine. In the following examples, 2-phenyl-imidazole is used.

Based on the total weight of the resin composition excluding solvent, the amount of the curing accelerator can be 0 wt % to 1.5 wt %. For example, based on the total weight of the resin composition excluding solvent, the amount of the curing accelerator can be 0.1 wt %, 0.2 wt %, 0.3 wt %, 0.4 wt %, 0.5 wt %, 0.6 wt %, 0.7 wt %, 0.8 wt %, 0.9 wt %, 1 wt %, 1.1 wt %, 1.2 wt %, 1.3 wt %, 1.4 wt %, or 1.5 wt %, or within a range between any two of the values described herein, but the present invention is not limited thereto.

1.4.3. Second Filler

In an embodiment of the present invention, the resin composition can further comprise a second filler. Examples of the second filler include, but are not limited to, organic or inorganic fillers selected from the group consisting of silica (including solid silica and hollow silica), aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, polytetrafluoroethylene (PTFE) powders, glass beads, ceramic whiskers, carbon nanotubes, and nanosized inorganic powders. These fillers can be used alone or in any combination.

Based on the total weight of the resin composition excluding solvent, the amount of the second filler can be 0 wt % to 20 wt %. For example, based on the total weight of the resin composition excluding solvent, the amount of the second filler can be 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, or 20 wt %, or within a range between any two of the values described herein, but the present invention is not limited thereto.

1.5. Preparation of Resin Composition

The resin composition of the present invention can be prepared into a varnish by thoroughly blending the components of the resin composition, including the epoxy resin (A), the dicyclopentadiene-based phenol resin (B), the first filler (C), and other optional components, with a stirrer, and dissolving or dispersing the resultant mixture in a solvent. The solvent can be any inert solvent that can dissolve or disperse the components of the resin composition but does not react with the components of the resin composition. Examples of the inert solvent include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrolidone (NMP). The aforementioned solvents can be used alone or in combination. The solvent content in the resin composition is not limited as long as the components of the resin composition can be evenly dissolved or dispersed therein. In the following examples, a mixture of methyl ethyl ketone and cyclohexanone is used as a solvent.

2. PREPREG

The present invention also provides a prepreg prepared from the aforementioned resin composition. The prepreg is prepared by impregnating or coating a substrate with the aforementioned resin composition and drying the impregnated or coated substrate. Examples of common substrate include, but are not limited to, papers, cloths, or mats made from a material selected from the group consisting of paper fibers, glass fibers, quartz fibers, organic polymer fibers, carbon fibers, and combinations thereof. Examples of the organic polymer fibers include, but are not limited to, high-modulus polypropylene (HMPP) fibers, polyamide fibers, ultra-high molecular weight polyethylene (UHMWPE) fibers, and liquid crystal polymer (LCP) fibers. The cloths made from the material selected from the aforementioned group can be woven or non-woven. In some embodiments of the present invention, 2116 reinforced glass fabric is used as a reinforcing material, and the resin composition is heated and dried at 175° C. for 2 to 15 minutes (B-stage) to prepare a semi-cured prepreg.

3. METAL-CLAD LAMINATE AND PRINTED CIRCUIT BOARD

The present invention also provides a metal-clad laminate, which is obtained by laminating the aforementioned prepreg with a metal foil. Specifically, the metal-clad laminate of the present invention comprises a dielectric layer and a metal layer, wherein the dielectric layer is provided from the aforementioned prepreg. The metal-clad laminate can be prepared by superimposing a plurality of the aforementioned prepregs as the dielectric layer, superimposing a metal foil (such as a copper foil, as the metal layer) on at least one external surface of the dielectric layer composed of the superimposed prepregs to provide a superimposed object, and then performing a hot-pressing operation to the superimposed object to obtain the metal-clad laminate. Alternatively, the metal-clad laminate can be prepared by coating the aforementioned resin composition directly on a metal foil and drying the coated metal foil.

The external metal foil of the metal-clad laminate can be further subjected to patterning to provide a printed circuit board.

4. EXAMPLES

4.1. Testing Methods

The present invention is further illustrated by the embodiments hereinafter, wherein the testing instruments and methods are as follows.

[Glass Transition Temperature (Tg) Test]

Eight prepregs are laminated with copper foils on both sides to obtain a copper-clad laminate. Then, the copper foil on both sides is etched to obtain an unclad laminate, which is used as the test sample. The unclad laminate undergoes a glass transition temperature (Tg) test under the following conditions: using a thermomechanical analyzer (TMA), according to the method described in IPC-TM-650 2.4.24.5, and increasing temperature at rate of 10° C. per minute from 35° C. to 300° C. The glass transition temperature (Tg, in ° C.) is recorded. A higher glass transition temperature is preferable. A difference in glass transition temperature of more than 5° C. indicates a significant difference between the samples (i.e., the presence of significant technical difficulty).

[Coefficient of Thermal Expansion (z-CTE) Test]

A thermomechanical analyzer (TMA) is used to measure the coefficient of thermal expansion of the fully cured resin composition in Z-direction (i.e., in the thickness direction of the substrate) (z-CTE). The testing method is as follows: preparing a sample of the fully cured resin composition sized at 5 mm×5 mm×1.5 mm; setting the conditions to a starting temperature of 30° C., an end temperature of 330° C., a heating rate of 10° C./min, and a load of 0.05 Newton (N); and subjecting the sample to a thermomechanical analysis under the aforementioned conditions in expansion/compression mode. This measures the values of thermal expansion per 1° C. within the range of 30° C. to 330° C., which are then averaged to obtain the z-CTE. The unit of z-CTE is %.

[Heat Resistance (T288) Test]

Six prepregs are laminated with copper foils on both sides to provide a copper-clad laminate sample sized at 6.5 mm in length×6.5 mm in width. The test is conducted following IPC-TM-650 2.4.24.1 using a thermal mechanical analyzer (TMA) at 288° C., and the duration until the copper-clad laminate delaminates is recorded. A longer duration before delamination indicates higher heat resistance of the copper-clad laminate. If delamination does not occur within 60 minutes, the result is recorded as ">60", meaning that the T288 heat resistance test can endure over 60 minutes without delamination.

[Solder Resistance Test]

Six prepregs are laminated with copper foils on both sides to provide a copper-clad laminate sample sized at 6.5 mm in length×6.5 mm in width. According to the method described in IPC-TM-650 2.4.23, the sample is immersed in a tin bath maintained at 288° C., and after being soaked for 20 seconds, it is removed to observe whether board delamination occurs (e.g., separation or blistering between the copper foil and the insulating layer and/or between the insulating layers). The soaking and removal procedure is repeated several times, and the number of immersions before delamination is recorded. If delamination does not occur after more than 20 immersions, it is marked as ">20."

[Water Absorption Test]

The weight (W1) of the copper-clad laminate sample is measured. Subsequently, the copper-clad laminate is placed in a container and subjected to a pressure cooker test (PCT) under the following conditions: 121° C., 100% relative humidity (R.H.), 1.2 atm, for a 5-hour duration. After moisture absorption, the weight (W2) is measured. The water absorption rate of the copper-clad laminate is calculated according to the following equation.

$$\text{Water absorption rate}=[(W2-W1)/W1]\times 100\%$$

[Heat Resistance after Moisture Absorption Test]

Eight prepregs are laminated with copper foils on both sides to obtain a copper-clad laminate. Then, the copper foil on both sides is etched to obtain an unclad laminate, which is used as the test sample. According to the method described in IPC-TM-650 2.6.16.1, a pressure cooker test (PCT) is performed under the following conditions: 121° C., 100% relative humidity (R.H.), 1.2 atm, for a 5-hour duration. Then, according to the method described in IPC-TM-650 2.4.23, the sample is immersed in a tin bath maintained at 288° C., and after being soaked for 10 seconds, it is removed to observe whether board delamination occurs (e.g., blistering or separation between the insulating layers). The soaking and removal procedure is repeated several times, and the number of immersions before delamination is recorded. If delamination does not occur after more than 10 immersions, it is marked as ">10."

[Flame Retardance Test]

The flame retardance test is performed according to UL94V (Vertical Burn). The copper-clad laminate is held vertically and exposed to a Bunsen burner to assess its self-extinguishing and comburent properties. The flame retardance levels are ranked as V0>V1>V2.

[Comparative Tracking Index (CTI) Test]

Eight prepregs are laminated with copper foils on both sides to obtain a copper-clad laminate. Then, the copper foil on both sides is etched to obtain an unclad laminate. The unclad laminate is cut into a sample with dimensions of 100 mm in length×100 mm in width×3 mm in height, to be used as the test sample. The measurement of each test sample is carried out according to the method described in ASTM D3638. A voltage of 100 volts is applied to the sample on the testing device, and then, every 30 seconds, a drop of 0.1 wt % ammonium chloride aqueous solution is added. The dripping continues while recording the number of drops before leakage tracking occurs. If no leakage tracking occurs after more than 50 drops, the voltage is increased by 50 volts to 150 volts, and the dripping test is repeated with the 0.1 wt % ammonium chloride aqueous solution. Following the same procedure, the voltage is increased by 50 volts for each test, from 100 volts to 600 volts. The evaluation criteria are as follows: if the voltage test at 600 volts does not result in leakage tracking, it is recorded as "○," indicating that the relative leakage tracking index will not fail between 600 volts and 700 volts, or it will not fail between 600 volts and 650 volts; and if the voltage test results in leakage tracking at a voltage lower than 600 volts, it is recorded as "x."

[Filling Test]

A glass-fiber epoxy substrate with 588 plated through holes, formed by panel plating, is prepared. The substrate has a thickness of 1.8 mm, and each plated through hole has a diameter of 0.9 mm. A 1078 NE-glass fiber fabric is impregnated or coated with the resin composition and dried at 175° C. for 2 to 5 minutes (B-stage), resulting a semi-cured prepreg (having a resin content of 70% and a thickness of 0.88 mm). Subsequently, two prepregs are placed on one side of the glass-fiber epoxy substrate with through holes and heated to 200° C. to 220° C. at a heating rate of 2° C./min to 4° C./min. The material is then hot-pressed and cured at this temperature under a full pressure of 18 $kg/cm^2$ (an initial pressure of 8 $kg/cm^2$) for 120 minutes to provide a sample for evaluation. The sample is examined under an optical microscope at 100× magnification to observe cross-sections of the 588 filled plated through holes. The results are assessed according to the following criteria: if all the plated through holes are completely filled or only a few through holes (59 or less) are not completely filled, the filling property of the resin composition is good, and the result is recorded as "○". However, if the resin composition leaks from the bottom of the through holes or if many of the through holes (more than 59) are not completely filled, the filling property of the resin composition is poor, and the result is recorded as "x".

4.2. List of Raw Materials Used in Examples and Comparative Examples

| Raw material | Description |
| --- | --- |
| BNE-210 | Bisphenol A epoxy resin, with a solid content of 80%, available from CCP Company |
| TFE-1250 | Trifunctional epoxy resin, with a solid content of 80%, available from CCP Company |

-continued

| Raw material | Description |
|---|---|
| PF-9110 | Dicyclopentadiene-based phenol resin, with a solid content of 70%, available from CCP Company |
| KY-616 | Dicyclopentadiene-based phenol resin, with a solid content of 100%, available from Guangzhou Lixin Company |
| PF-8110 | Phenolic novolac resin, with a solid content of 65%, available from CCP Company |
| BM0015 | Boehmite filler, D50 = 1.1 μm, available from Suzhou Ginet New Material Technology Company |
| BG-611 | Boehmite filler, D50 = 1.0 μm, available from Anhui Estone Materials Company |
| BG-613 | Boehmite filler, D50 = 3.0 μm, available from Anhui Estone Materials Company |
| BG-403 | Boehmite filler, D50 = 4.5 um, available from Anhui Estone Materials Company |
| BMOP40 | Boehmite filler, D50 = 0.4 μm, available from Suzhou Ginet New Material Technology Company |
| PAX-3700 | Curing agent, benzoxazine resin, with a solid content of 65%, available from Nanokor Company |
| DICY | Curing agent, dicyandiamide, with a solid content of 100%, available from Eumate Internation Corporation |
| 2PI | Curing accelerator, with a solid content of 100%, available from Shikoku Chemicals Corporation |
| Q089 | Silicon dioxide filler, available from Suzhou Ginet New Material Technology Company |
| CL-303 | Aluminum hydroxide, available from Sumitomo Company |
| SPB-100 | Flame retardant, with a solid content of 100%, available from Otsuka Chemical Company |
| XZ92741 | Flame retardant, with a solid content of 100%, available from Olin Company |

4.3. Preparation of Resin Composition

According to the components and proportions shown in Table 1-1, Table 1-2 and Table 2, the components were mixed using a stirrer at room temperature, and methyl ethyl ketone and cyclohexanone (both available from Methyl Corporation) were added. Then, the resultant mixture was stirred at room temperature for 60 to 120 minutes to obtain the resin compositions of Examples E1 to E13 and Comparative Examples CE1 to CE6.

TABLE 1-1

| Unit: parts by weight (solid content) | | E1 | E2 | E3 | E4 | E5 | E6 | E7 |
|---|---|---|---|---|---|---|---|---|
| Epoxy resin (A) | BNE-210 | | | | | 57 | 49 | 20 |
| | TFE-1250 | 57 | 57 | 57 | 57 | | | 37 |
| Dicyclopentadiene-based phenol resin (B) | PF-9110 | 15 | | 13 | 10 | 5 | 20 | 5 |
| | KY-616 | | 15 | | | | | |
| Phenolic resin | PF-8110 | | | | | | | |
| First filler (C)/boehmite filler | BM0015 | 40 | 40 | 40 | 40 | 40 | 40 | 40 |
| | BG-611 | | | | | | | |
| | BG-613 | | | | | | | |
| | BG-403 | | | | | | | |
| | BM0P40 | | | | | | | |
| Curing agent | PAX-3700 | 7 | 7 | 9 | 12 | 17 | 10 | 17 |
| | DICY | 0.5 | 0.5 | 0.5 | 0.5 | 0.5 | 0.5 | 0.5 |
| Curing accelerator | 2PI | 1.5 | 1.4 | 1.2 | 1.0 | 0.7 | 0.8 | 0.7 |
| Second filler | Q089 | 5 | 5 | 5 | | 5 | 5 | |
| | CL-303 | | | | 5 | | | 5 |
| Flame retardant | SPB-100 | | 5 | | | | | |
| | XZ92741 | 20 | 15 | 20 | 20 | 20 | 20 | 20 |

TABLE 1-2

| Unit: parts by weight (solid content) | | E8 | E9 | E10 | E11 | E12 | E13 |
|---|---|---|---|---|---|---|---|
| Epoxy resin (A) | BNE-210 | | | | | | |
| | TFE-1250 | 64 | 57 | 57 | 57 | 57 | 57 |
| Dicyclopentadiene-based phenol resin (B) | PF-9110 | 15 | 15 | 15 | 15 | 15 | 15 |
| | KY-616 | | | | | | |
| Phenolic resin | PF-8110 | | | | | | |
| First filler (C)/boehmite filler | BM0015 | 20 | 30 | 45 | | 40 | |
| | BG-611 | | | | 40 | | |
| | BG-613 | | | | | | 40 |
| | BG-403 | | | | | | |
| | BMOP40 | | | | | | |

TABLE 1-2-continued

| Unit: parts by weight (solid content) | | E8 | E9 | E10 | E11 | E12 | E13 |
|---|---|---|---|---|---|---|---|
| Curing agent | PAX-3700 | | 7 | 7 | 7 | 7 | 7 |
| | DICY | 0.5 | | 0.5 | 0.5 | 0.5 | 0.5 |
| Curing accelerator | 2PI | 1.3 | 1.6 | 1.5 | 1.6 | 1.5 | 1.5 |
| Second filler | Q089 | 5 | 5 | | 5 | 5 | 5 |
| | CL-303 | 20 | 15 | | | | |
| Flame retardant | SPB-100 | | | | | | |
| | XZ92741 | 20 | 20 | 20 | 20 | 20 | 20 |

TABLE 2

| Unit: parts by weight (solid content) | | CE1 | CE2 | CE3 | CE4 | CE5 | CE6 |
|---|---|---|---|---|---|---|---|
| Epoxy resin (A) | BNE-210 | | | | | | |
| | TFE-1250 | 73 | 52 | | 52 | 57 | 57 |
| Dicyclopentadiene-based phenol resin (B) | PF-9110 | | 20 | 20 | | 15 | 15 |
| | KY-616 | | | | | | |
| Phenolic resin | PF-8110 | | | | 20 | | |
| First filler (C)/ boehmite filler | BM0015 | 40 | | 40 | 40 | | |
| | BG-611 | | | | | | |
| | BG-613 | | | | | | |
| | BG-403 | | | | | 40 | |
| | BM0P40 | | | | | | 40 |
| Curing agent | PAX-3700 | 7 | 6 | 58 | 7 | 7 | 7 |
| | DICY | 0.5 | 0.5 | 0.5 | 0.5 | 0.5 | 0.5 |
| Curing accelerator | 2PI | 0.4 | 2.5 | 2.3 | 0.6 | 1.1 | 1.3 |
| Second filler | Q089 | 5 | 45 | 5 | | 5 | 5 |
| | CL-303 | | | | 5 | | |
| Flame retardant | SPB-100 | | 20 | 20 | 20 | | |
| | XZ92741 | 20 | | | | 20 | 20 |

4.4. Preparation and Property Measurements of Metal-Clad Laminate

Metal-clad laminates of Examples E1 to E13 and Comparative Examples CE1 to CE6 were individually prepared using the respective prepared resin compositions. Initially, glass fiber cloths (Model No.: 2116; thickness: 0.08 mm) were impregnated with the resin compositions of Examples E1 to E13 and Comparative Examples CE1 to CE6 using roll coaters. The thicknesses of these impregnated glass fiber cloths were carefully controlled. Subsequently, the impregnated glass fiber cloths underwent drying in an oven at 175° C. for 2 minutes to 15 minutes, resulting in semi-cured (B-stage) prepregs (resin content of the prepreg: 55%). Afterward, multiple prepregs were superimposed, and two sheets of 0.5-ounce high temperature elongation (HTE) copper foils were superimposed on the respective two surfaces of the outermost layers. The superimposed objects were then subjected to a high-temperature curing process using a hot pressing under the following conditions: heating to 200° C. to 220° C. at a heating rate of 3° C./min, and hot-pressing at 200° C. to 220° C. for 180 minutes under a full pressure of 15 $kg/cm^2$ (with an initial pressure of 8 $kg/cm^2$).

The properties of the metal-clad laminates of Examples E1 to E13 and Comparative Examples CE1 to CE6, including glass transition temperature (Tg), coefficient of thermal expansion (z-CTE), dielectric properties, heat resistance (T288), solder resistance, water absorption rate, heat resistance after moisture absorption, flame retardance, comparative tracking index (CTI), and filling property were tested according to the aforementioned testing methods. The results are tabulated in Table 3-1, Table 3-2 and Table 4.

TABLE 3-1

| | E1 | E2 | E3 | E4 | E5 | E6 | E7 |
|---|---|---|---|---|---|---|---|
| Tg (° C.) | 183 | 180 | 185 | 190 | 195 | 176 | 192 |
| Z-CTE (%) | 1.90 | 1.92 | 1.85 | 1.83 | 1.79 | 1.95 | 1.82 |
| Heat resistance (min) | >60 | >60 | >60 | >60 | >60 | >60 | >60 |
| Solder resistance (times) | >20 | >20 | >20 | >20 | >20 | >20 | >20 |
| Water absorption rate (%) | 0.30 | 0.33 | 0.37 | 0.43 | 0.49 | 0.28 | 0.50 |
| Heat resistance after moisture absorption (times) | >10 | >10 | >10 | >10 | >10 | >10 | >10 |
| UL-94 grade | V0 | V0 | V0 | V0 | V0 | V0 | V0 |
| CTI | ○ | ○ | ○ | ○ | ○ | ○ | ○ |
| Filing property | ○ | ○ | ○ | ○ | ○ | ○ | ○ |

TABLE 3-2

| | E8 | E9 | E10 | E11 | E12 | E13 |
|---|---|---|---|---|---|---|
| Tg (° C.) | 179 | 184 | 182 | 181 | 182 | 181 |
| z-CTE (%) | 1.93 | 1.91 | 1.93 | 1.91 | 1.92 | 1.91 |
| Heat resistance (min) | >60 | >60 | >60 | >60 | >60 | >60 |
| Solder resistance (times) | >20 | >20 | >20 | >20 | >20 | >20 |
| Water absorption rate (%) | 0.48 | 0.43 | 0.35 | 0.38 | 0.43 | 0.47 |
| Heat resistance after moisture absorption (times) | >10 | >10 | >10 | >10 | >10 | >10 |
| UL-94 grade | V0 | V0 | V0 | V0 | V0 | V0 |
| CTI | ○ | ○ | ○ | ○ | ○ | ○ |
| Filing property | ○ | ○ | ○ | ○ | ○ | ○ |

TABLE 4

| | CE1 | CE2 | CE3 | CE4 | CE5 | CE6 |
|---|---|---|---|---|---|---|
| Tg (° C.) | 199 | 169 | 162 | 160 | 183 | 180 |
| z-CTE (%) | 1.77 | 2.50 | 2.80 | 2.90 | 1.90 | 1.95 |
| Heat resistance (min) | >60 | >60 | 40 | >60 | >60 | >60 |
| Solder resistance (times) | 5 | >20 | 15 | 3 | 7 | 9 |
| Water absorption rate (%) | 0.75 | 0.52 | 0.54 | 0.86 | 0.75 | 0.70 |
| Heat resistance after moisture absorption (times) | 1 | >10 | 1 | 1 | 2 | 3 |
| UL-94 grade | V0 | V0 | V0 | V0 | V0 | V0 |
| CTI | x | x | ○ | ○ | ○ | ○ |
| Filing property | x | ○ | ○ | ○ | x | x |

As shown in Table 3-1, Table 3-2, and Table 4, the resin composition of the present invention and the metal foil laminate produced therefrom exhibit excellent glass transition temperature, coefficient of thermal expansion, heat resistance, solder resistance, resistance to water absorption, heat resistance after moisture absorption, flame retardance, comparative tracking index, and filling property. In contrast, the comparative examples demonstrate that if the resin composition does not simultaneously contain epoxy resin (A), dicyclopentadiene-based phenol resin (B), and a first filler with specific particle size (C), the aforementioned excellent properties cannot be provided simultaneously. Specifically, Comparative Examples CE1, CE2, and CE3 show that in the absence of any one of epoxy resin (A), dicyclopentadiene-based phenol resin (B), or the first filler (C) with specific particle size, the resin composition cannot exhibit the above-mentioned excellent properties. Comparative example CE4 shows that if a conventional phenolic resin is used to replace the dicyclopentadiene-based phenol resin (B) of the present invention, the glass transition temperature of the cured resin composition is low, the coefficient of thermal expansion is high, and the resulting metal foil laminate exhibits poor solder resistance, resistance water absorption, and heat resistance after moisture absorption. Comparative examples CE5 and CE6 show that if the D50 particle size of the boehmite filler is greater than or smaller than the specified range of the present invention, the resulting metal foil laminate exhibits poor solder heat resistance, resistance to water absorption, heat resistance after moisture absorption, and filling property.

The above examples are used to illustrate the principle and efficacy of the present invention and show the inventive features thereof, but are not used to limit the scope of the present invention. People skilled in this field may proceed with a variety of modifications and replacements based on the disclosures and suggestions of the invention as described. Therefore, the scope of protection of the present invention is that as defined in the claims as appended.

What is claimed is:

1. A resin composition, comprising:

(A) an epoxy resin;

(B) a dicyclopentadiene-based phenol resin; and (C) a first filler, which is a boehmite filler having a D50 diameter ranging from 1 μm to 4 μm, wherein the dicyclopentadiene-based phenol resin (B) has a structure represented by the following formula (I):

formula (I)

$$Ph-(D-Ph)_n-D-Ph,$$

wherein, n is an integer of 2 to 50;

Ph is independently a hydroxyl-containing group derived from an aromatic phenol compound; and D has a structure represented by the following formula (II), and each D is the same or different:

formula (II)

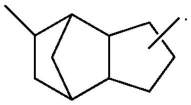

2. The resin composition of claim 1, wherein the epoxy resin (A) is selected from the group consisting of a bisphenol epoxy resin, a phenolic epoxy resin, a trifunctional epoxy resin, a diphenylethylene epoxy resin, a triazine skeleton-containing epoxy resin, a fluorene skeleton-containing epoxy resin, a triphenol methane epoxy resin, a xylylene epoxy resin, a biphenyl epoxy resin, a biphenyl aralkyl epoxy resin, a naphthalene epoxy resin, an alicyclic epoxy resin, and combinations thereof.

3. The resin composition of claim 1, wherein the content of the dicyclopentadiene-based phenol resin ranges from 3 wt % to 15 wt % based on the total weight of the resin composition excluding solvent.

4. The resin composition of claim 1, wherein the content of the first filler ranges from 10 wt % to 31 wt % based on the total weight of the resin composition excluding solvent.

5. The resin composition of claim 3, wherein the content of the first filler ranges from 10 wt % to 31 wt % based on the total weight of the resin composition excluding solvent.

6. The resin composition of claim 1, which further comprises a curing agent selected from the group consisting of a cyanate ester resin, a benzoxazine resin, a non-dicyclopentadiene-based phenol resin, a styrene maleic anhydride (SMA) resin, dicyandiamide (Dicy), diaminodiphenyl sulfone (DDS), diaminodiphenylmethane, and combinations thereof.

7. The resin composition of claim 5, which further comprises a curing agent selected from the group consisting of a cyanate ester resin, a benzoxazine resin, a non-dicyclopentadiene-based phenol resin, a styrene maleic anhydride (SMA) resin, dicyandiamide (Dicy), diaminodiphenyl sulfone (DDS), diaminodiphenylmethane, and combinations thereof.

8. The resin composition of claim 1, which further comprises a second filler selected from the group consisting of silica, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, polytetrafluoroethylene (PTFE), glass beads, ceramic whiskers, carbon nanotubes, nanosized inorganic powders, and combinations thereof.

9. The resin composition of claim 5, which further comprises a second filler selected from the group consisting of silica, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, polytetrafluoroethylene (PTFE), glass beads, ceramic whiskers, carbon nanotubes, nanosized inorganic powders, and combinations thereof.

10. The resin composition of claim 7, which further comprises a second filler selected from the group consisting of silica, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, polytetrafluoroethylene (PTFE), glass beads, ceramic whiskers, carbon nanotubes, nanosized inorganic powders, and combinations thereof.

11. A prepreg, which is prepared by impregnating a substrate with the resin composition of claim 1 or by coating the resin composition of claim 1 onto a substrate and drying the impregnated or coated substrate.

12. A metal-clad laminate, which is prepared by laminating the prepreg of claim 11 and a metal foil.

13. A printed circuit board, which is prepared from the metal-clad laminate of claim 12.

14. A metal-clad laminate, which is prepared by coating the resin composition of claim 1 onto a metal foil and drying the coated metal foil.

15. A printed circuit board, which is prepared from the metal-clad laminate of claim 14.

* * * * *